(12) United States Patent
Nickkolgh et al.

(10) Patent No.: US 11,943,874 B2
(45) Date of Patent: Mar. 26, 2024

(54) STACKING ARRAYS AND SEPARATOR BODIES DURING PROCESSING OF COMPONENT CARRIERS ON ARRAY LEVEL

(71) Applicant: AT&S (Chongqing) Company Limited, Chongqing (CN)

(72) Inventors: Amin Nickkolgh, Tehran (IR); Yu-Hui Wu, Taoyuan (CN); Ismadi Bin Ismail, Kuching (MY)

(73) Assignee: AT&S (Chongqing) Company Limited, Chongqing (CN)

( * ) Notice: Subject to any disclaimer, the term of this patent is extended or adjusted under 35 U.S.C. 154(b) by 0 days.

(21) Appl. No.: 17/247,456

(22) Filed: Dec. 11, 2020

(65) Prior Publication Data

US 2021/0195753 A1    Jun. 24, 2021

(30) Foreign Application Priority Data

Dec. 20, 2019    (CN) .......................... 201911325379.2

(51) Int. Cl.
*H05K 3/00*    (2006.01)

(52) U.S. Cl.
CPC .......... *H05K 3/007* (2013.01); *H05K 3/0097* (2013.01); *H05K 2203/0156* (2013.01); *H05K 2203/1105* (2013.01); *H05K 2203/162* (2013.01)

(58) Field of Classification Search
CPC ................. H05K 3/007; H05K 3/0097; H05K 2203/0156; H05K 2203/1105; H05K 2203/162

(Continued)

(56) References Cited

U.S. PATENT DOCUMENTS

| 4,210,243 A | 7/1980 | McDowell |
|---|---|---|
| 5,103,976 A | 4/1992 | Murphy |

(Continued)

FOREIGN PATENT DOCUMENTS

| CN | 109152233 A | 1/2019 |
|---|---|---|
| CN | 109637981 A | 4/2019 |

(Continued)

OTHER PUBLICATIONS

First Office Action in Application 201911325379.2; pp. 1-9; dated Dec. 15, 2021; China National Intellectual Property Administration; No. 6, Xitucheng Lu, Jimenqiao Haidian District, Beijing City, 100088, China.

(Continued)

*Primary Examiner* — Livius R. Cazan (74) *Attorney, Agent, or Firm* — Robert A. Blaha; Smith Tempel Blaha LLC (57) ABSTRACT

A method of processing component carriers is disclosed. The method includes providing a plurality of arrays each comprising a plurality of component carriers, providing a plurality of separator bodies, forming an alternating stack of the arrays and the separator bodies so that each adjacent pair of stacked arrays is spaced by a respective separator body, and carrying out at least one process, in particular at least one back-end process, using the stack. A separator sheet for spacing arrays and a method of using separator sheets for spacing arrays during processing the arrays are also provided.

18 Claims, 3 Drawing Sheets

(58) Field of Classification Search
USPC .............. 29/829, 825, 592.1, 700, 739, 740
See application file for complete search history.

(56) References Cited

U.S. PATENT DOCUMENTS

| | | | | |
|---|---|---|---|---|
| 5,335,771 | A * | 8/1994 | Murphy | H05K 7/1084 |
| | | | | 206/725 |
| 5,499,164 | A | 3/1996 | Hill-Lindsay et al. | |
| 5,547,082 | A * | 8/1996 | Royer | H05K 13/0084 |
| | | | | 206/725 |
| 6,202,883 | B1 | 3/2001 | Kakinoki et al. | |
| 6,984,571 | B1 | 1/2006 | Enquist | |
| 9,184,076 | B2 * | 11/2015 | Aihara | H01L 21/67333 |
| 2016/0381806 | A1 * | 12/2016 | Miyoshi | H05K 1/09 |
| | | | | 156/233 |
| 2020/0163223 | A1 | 5/2020 | Mok et al. | |
| 2021/0028061 | A1 * | 1/2021 | Farooq | H01L 21/56 |

FOREIGN PATENT DOCUMENTS

| | | |
|---|---|---|
| EP | 1041866 A2 | 10/2000 |
| JP | H09232777 A | 9/1997 |
| JP | H10502209 A | 2/1998 |
| JP | 2001044220 A * | 2/2001 |
| JP | 2001044220 A | 2/2001 |
| KR | 200307057 Y1 | 3/2003 |
| WO | 99/03130 A1 | 1/1999 |

OTHER PUBLICATIONS

English Translation of cover pages of First Office Action in Application 201911325379.2; pp. 1-3; dated Dec. 15, 2021; China National Intellectual Property Administration; No. 6, Xitucheng Lu, Jimenqiao Haidian District, Beijing City, 100088, China.

Lachaud, S.; Extended European Search Report in Application No. 20 213 052.2; pp. 1-7; dated May 14, 2021; European Patent Office; 80298, Munich, Germany.

* cited by examiner

STACKING ARRAYS AND SEPARATOR BODIES DURING PROCESSING OF COMPONENT CARRIERS ON ARRAY LEVEL

CROSS-REFERENCE TO RELATED APPLICATIONS

This application claims the benefit of the filing date of the Chinese Patent Application No. 201911325379.2, filed Dec. 20, 2019, the disclosure of which is hereby incorporated herein by reference.

TECHNICAL FIELD

The disclosure relates to a method of processing component carriers, a separator body, and a method of use.

BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

In particular during back-end processing, component carriers in an array compound are prone to damage.

SUMMARY

There may be a need to process component carriers on array level with high yield and reasonable effort.

According to an exemplary embodiment of the invention, a method of processing component carriers (for instance printed circuit boards or pre-forms thereof) is provided, wherein the method comprises providing a plurality of arrays each comprising a plurality of component carriers, providing a plurality of separator bodies (in particular separator sheets), forming an alternating stack of the arrays and the separator bodies so that each adjacent pair of stacked arrays is spaced by a respective separator body (in particular in such a way that any direct physical contact between adjacent arrays is disabled by the separator body in between), and carrying out at least one process (preferably at least one back-end process) using the stack or with the stack.

According to another exemplary embodiment of the invention, a separator sheet for spacing arrays, each comprising a plurality of component carriers, is provided, wherein the separator sheet is temperature stable at least up to 300° C. (in particular, the material of the separator sheet may withstand temperatures of at least 300° C. without damage or loss of its separation function), has a surface roughness Ra below 3 μm, and is non-adhesive with respect to foreign particles (in particular, the material of the separator sheet may be configured so that foreign particles which may occur during component carrier manufacturing, such as dust and/or residues from a component carrier manufacturing process, do not adhere to the separator sheet).

According to still another exemplary embodiment of the invention, a separator sheet having the above-mentioned features is used for spacing arrays, each comprising a plurality of component carriers, during at least part of processing (preferably at least part of back-end processing) the arrays.

OVERVIEW OF EMBODIMENTS

In the context of the present application, the term "component carrier" may particularly denote any support structure which is capable of accommodating one or more components thereon and/or therein for providing mechanical support and/or electrical connectivity and/or optical connectivity and/or thermal connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "array" may particularly denote a still integrally connected body composed of multiple preforms of component carriers. For instance, such an array may originally form part of a panel, which may be an even larger format, compared to an array, used during manufacturing component carriers. In the process of manufacturing component carriers, a panel is processed and then separated in arrays. The arrays may be further processed and may then be separated into individual component carriers. For instance, an array may comprise six component carriers.

In the context of the present application, the term "back-end processing" may particularly denote a processing of the array after separation of a panel into arrays and before separation of the array into individual component carriers. In particular, an interface between front-end processing and back-end processing may be routing where the arrays get separated from panel form. Back-end processes may start when the arrays are removed from the panel.

In the context of the present application, the term "separator bodies" may particularly denote preferably flat bodies being configured for being interposed or arranged between arrays of preforms of component carriers so that each separator body is sandwiched between two arrays to prevent a direct physical contact between the two arrays. It is of course possible that a separator body also forms an uppermost or lowermost element of a stack of separator bodies and arrays, so that in such an event only one main surface of the separator body may be in direct physical contact with an array, whereas the other main surface of such a separator body forms part of an exterior exposed surface of the stack. Separator sheets may be sheet shaped separator bodies.

According to an exemplary embodiment of the invention, a handling system for arrays each including a plurality of preforms of component carriers being presently processed is provided. In such a handling system, the arrays are stacked during at least part of processing, preferably back-end processing (i.e., processing after having separated a panel into multiple arrays), with one or more separator bodies being arranged in between adjacent arrays so as to prevent a direct physical contact of one array with another one. It has turned out that, by providing separator bodies separating adjacent arrays, the risk of scratches and an undesired transfer of process residues between the arrays may be reliably prevented. It has furthermore turned out as advantageous to configure the separator bodies in such a way that the stack may remain together during carrying out at least part of the back-end processes (for instance during a baking procedure for dewarping and deoxidizing). As a result, an efficient handling of arrays during processing (and preferably back-end processing) may be ensured with low effort and with a significant reduction of the risk of damage of the arrays during (back-end) processing. Consequently, the throughput and the yield of component carrier manufacture may be significantly improved by spacing arrays by separator sheets during (preferably) back-end processing.

According to another exemplary embodiment of the invention, separator sheets may be provided as sheet-like separator bodies which can be used highly advantageously for the above-described purpose. In order to be capable of withstanding elevated temperatures, which may occur during (in particular back-end) processes such as baking, it is highly advantageous that the separator bodies are adapted to withstand temperatures of up to at least 300° C. This also increases the freedom of a circuit designer of freely selecting a baking temperature without the risk of damage, burning, etc. Moreover, it has turned out as an important property of the separator body that its surface has a roughness Ra of less than 3 µm, in particular less than 2 µm. It has turned out that such smooth surfaces of separator bodies are effective for reliably preventing scratching of surfaces of the arrays. When making sure that the material of the separator sheet is non-adhesive with respect to foreign particles which may occur during processing component carriers, it can be ensured that contamination of the component carriers due to dust and other particles, as well as scratching, can be safely prevented.

In the following, further exemplary embodiments of the processing method, the separator body, and the method of use will be explained.

The roughness of a surface may be defined as and may be measured as the centerline average height Ra. Ra is the arithmetic mean value of all distances of the profile from the centerline. The roughness of a surface may however also be defined as and may be measured as average roughness depth Rz. Rz can be determined when a reference length is sampled from a roughness curve in a direction of a mean line, and may denote the distance between the top profile peak line and the bottom profile valley line on this sampled portion as measured in the longitudinal direction of the roughness curve (for instance, Rz may be determined by averaging over five individual measuring paths). For instance, the measurement or determination of roughness Ra and Rz of the separator sheet or body, as mentioned in the context of the present application, may be carried out according to DIN EN ISO 4287:2010 (which is a German industrial standard).

In an embodiment, the method comprises carrying out said at least one back-end process while the arrays remain stacked with and spaced by the separator bodies. Highly advantageously, it is possible to make an entire stack of alternating arrays and separator bodies subject to at least one back-end process without unstacking them. In other words, said at least one back-end process may be carried out with the arrays and the separator bodies in their stacked condition. This at the same time ensures a gentle handling of the sensitive arrays while also increasing the efficiency of back-end processing due to the batch like processing of an entire stack rather than individual arrays. During such a procedure, no unstacking of the alternating sequence of arrays and separator bodies occurs.

In a preferred embodiment, said at least one back-end process carried out while the arrays remain stacked with the separator bodies in between comprises baking the stack. More specifically, the method may comprise baking the stack in an oven at a temperature of at least 200° C., in particular of at least 250° C. Hence, baking of arrays may be advantageous in an oven or the like for bringing the arrays with the preforms of component carriers to an elevated temperature, for instance of up to 300° C. It has turned out that such a baking (preferably in a nitrogen atmosphere) contributes to a dewarping and deoxidation of the arrays and their component carriers. Highly advantageously, it has turned out that such a baking procedure may be carried out properly in a stacked state of the arrays with separator bodies in between. Preferably, the separator bodies should be temperature-stable at least up to 300° C. in order to be capable of withstanding the thermal load acting on the separator bodies during baking.

In an embodiment, the method comprises maintaining the arrays and the separator bodies stacked between subsequent back-end processes, and individually picking each array from the stack for carrying out a respective one of said back-end processes with the respective picked array. Hence, it may also be advantageous to unstack the stack of arrays and separator bodies during certain back-end processes, while keeping them stacked between subsequent back-end processes. By providing an automatically operating stacker/unstacker mechanism, the back-end processing may be automated while simultaneously preventing damage of the arrays during handling.

In an embodiment, the method comprises handling the stack for transferring the stack between subsequent back-end processes without unstacking. Thus, when the arrays are transported from one back-end processing stage to the next back-end processing stage (for instance from an electronic test stage to an automatic visual inspection stage), the arrays may remain stacked during the transport with the separator sheets in between. Handling the stack for a transfer between different back-end stages may be fully automatic and may not require handling the arrays by a human operator. This may further reduce the risk of damage.

In an embodiment, said at least one back-end process carried out with an individually picked array comprises a functional test. For instance, such a functional test may be an electronic test testing the electronic functionality of the individual component carriers of the array. In order to allow probes of an electric test device to contact the individual component carriers of an array, unstacking them before carrying out the electronic test may be advantageous.

In an embodiment, said at least one back-end process carried out with an individually picked array comprises an inspection, in particular an optical inspection, more particularly an automatic optical inspection. Automatic optical inspection may involve an optical image device such as a camera capable of capturing an image of a respective array. The array image may then be compared with a reference image to determine automatically as to whether the array or component carrier of the array is structurally intact or may need to be classified as defective. During carrying out such an optical inspection, the alternating stack of arrays and separator bodies may be unstacked so as to enable the camera to capture an individual image of each front side and/or back side of each individual array.

In an embodiment, said at least one back-end process carried out with an individually picked array comprises marking, in particular laser marking, a defective array or a defective component carrier of the array. Also marking a component carrier of an array or the entire array as defective (for instance by laser engraving a corresponding identifier such as a cross on said component carrier or array), temporarily unstacking the arrays may be advantageous.

In an embodiment, said at least one back-end process carried out with an individually picked array comprises cleaning the stack. Also, cleaning is a back-end process. During cleaning, the stack may be brought in interaction with a cleaning medium, for instance the stack may be rinsed. The arrays may be run through the cleaning process in one stack high, i.e., individually to thereby achieve efficient cleaning.

In an embodiment, the method comprises forming again an alternating stack of the arrays and the separator bodies after said at least one back-end process carried out with individually picked arrays, so that each adjacent pair of stacked arrays is again spaced by a respective separator body. Thus, after having unstacked the individual arrays and separator bodies for making the individual arrays subject to a certain back-end process (such as automatic optical inspection), reforming the stack returns the arrays into a state in which they are reliably prevented from scratching and undesired transfer of process residues, and other defects.

In an embodiment, the method comprises providing the separator bodies and the arrays so that a main surface area of each separator body is equal to a main surface area of each array. Thus, the separator bodies may have the same size as the arrays. This saves material and nevertheless ensures that the entire surfaces of the arrays are prevented from damage. Moreover, this simplifies handling of the stack as a whole, in particular in an automated manner.

In an embodiment, the method comprises forming the line/space ratio of the component carriers manufactured based on the arrays smaller than 30 µm, in particular in a range between 1 µm and 30 µm. In particular when small line/space ratios are desired, the advantageous effects provided by the separator sheets are specifically pronounced. Thus, even in critical small line/space configurations, the one or more separator bodies may reliably prevent contamination by particle generation, formation of scratches and the like.

In an embodiment, the method comprises selectively reusing or disposing the separator bodies after the back-end processing during which the separator bodies have served as spacers between adjacent arrays. When the separator bodies are reused for the next back-end process, a small footprint and a low effort may be combined. However, when the separator bodies are contaminated or damaged after one or more back-end cycles, they may be disposed for ensuring high quality of component carrier manufacture.

In an embodiment, the method comprises carrying out unstacking and reforming the stack of the arrays and the separator bodies between subsequent back-end processes. Repeated stacking and unstacking of the stack may at the same time ensure protecting the arrays from scratching and contamination whenever possible during back-end processing without compromising on the quality of the back-end processes which may partially require unstacked arrays.

In an embodiment, a material of the separator sheet is paper. Paper has turned out as a cheap and highly appropriate material for the separator sheets. However, other materials such as plastic sheets (for instance made of polytetrafluoroethylene (PTFE) or being coated with PTFE) are possible.

In an embodiment, the separator sheet is substantially sulfur-free. Highly advantageous, the separator sheet may be completely free of sulfur. When component carriers are provided with a gold surface finish, the presence of sulfur may damage the component carriers. Sulfur has been identified as being critical for PCB manufacture, IC substrate manufacture and semiconductor processes, so that also in the event of embedding one or more components in a component carrier, sulfur should be avoided in excessive amount. Hence, providing the separator bodies of a material being substantially free of sulfur (in particular having a sulfur content of less than 1 ppm) allows reliably improving the throughput and yield of the component carrier manufacturing or processing architecture.

In an embodiment, the separator sheet has a surface roughness Ra below 2 µm. Thus, a surface roughness Ra below 2 µm, measured according to the above-mentioned standard, is particularly advantageous for preventing scratches. For instance, the surface roughness Ra may be in a range between 0.5 µm and 2 µm.

In an embodiment, the separator sheet has a surface roughness Rz below 20 µm, in particular below 15 µm. Hence, a maximum roughness Rz of 20 µm, preferably 15 µm, measured according to the above-described standard, has turned out as advantageous for obtaining component carriers without artefacts or damage. For instance, the surface roughness Rz may be in a range between 4 µm and 15 µm.

In an embodiment, the separator sheet has a thickness in a range between 30 µm and 100 µm, in particular in a range between 50 µm and 80 µm. In an embodiment, the separator sheet has a length and/or a width in a range between 1 cm and 50 cm, in particular in a range between 5 cm and 30 cm.

In an embodiment, the separator sheet comprises at least one material of the group consisting of an electrostatic discharge control material, ultra-high molecular weight polyethylene, polyoxymethylene, silicon, polyethylene terephthalate, and polyetheretherketone. Hence, a wide range of materials for the interleaf is possible. The separator sheet may comprise ESD (electro-static discharge) control materials (for controlling the ESD properties of the stack and/or its individual constituents), UPE (ultra-high molecular weight polyethylene), or PON (Polyoxymethylene). It is also possible that the interleaf layers are made of silicon. Additionally or alternatively, the separator sheet may comprise one or more PET (polyethylene terephthalate) composite films which can show both very low roughness and high temperature performance (PET composite may have a higher melting temperature compared to pure PET films). Also, polyetheretherketone (PEEK), which has a melting temperature of above 300° C. may be used. A surface roughness of PEEK composite films can be adjusted to be below 3 µm.

In an embodiment, the separator sheet is configured to protect the arrays against at least one of the group consisting of vibration, mechanical shock, and humidity. Advantageously, the separator sheet or interleaf may protect an adjacent array against vibrations and may function for shock absorption (i.e., for damping, buffering or cushioning stress). The separator sheet may be capable of absorbing humidity. It may fulfil ESD requirements and may provide advantageous properties in terms of particle density.

In an embodiment, the separator sheet comprises at least one hole for supporting vacuum suction. By such a vacuum suction, a vacuum suction device may suck an array together with a separator sheet by a suction force, for instance for handling purposes. The suction force may be transferred from the vacuum suction device to the array via the one or holes in the intermediate separator sheet. More specifically, the separator sheet or interleaf can have one or more slots, holes, openings and/or may be made of porous material to support vacuum suction.

In an embodiment, the method comprises automatically handling an alternating stack of said separator sheets and said arrays, in particular without touching by a human operator. Automatically handling the separator sheets without manual handling by a human operator prevents the component carriers from deterioration or damage. For instance, such a mechanism may further reduce the risk of scratches.

In an embodiment, the component carriers comprise a stack of at least one electrically insulating layer structure and at least one electrically conductive layer structure. In the context of the present application, the term "layer structure" may particularly denote a continuous layer, a patterned layer or a plurality of non-consecutive islands within a common plane. A layer structure may be electrically insulating and/or electrically conductive. For example, the component carriers may be a laminate of the mentioned electrically insulating layer structure(s) and electrically conductive layer structure(s), in particular formed by applying mechanical pressure and/or thermal energy. The mentioned stack may provide plate-shaped component carriers capable of providing a large mounting surface for further components and being nevertheless very thin and compact.

In an embodiment, the component carriers are shaped as a plate. This contributes to the compact design, wherein the component carriers nevertheless provide a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carriers formed on the basis of the array is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, each of the above mentioned electrically insulating layer structures comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Delaware, U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, each of the above mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. For instance, the electronic component may be a radiofrequency semiconductor chip configured for emitting and/or receiving radiofrequency signals via the wiring structures and being electrically coupled with the electrically conductive wiring structures. Hence, the electronic component may be configured for executing a radio frequency application, in particular a radio frequency application involving frequencies above 1 GHz.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an opto-electronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carriers are laminate-type component carriers. In such an embodiment, the component carrier is a compound of multiple layer structures which are stacked and connected together by applying a pressing force and/or heat.

After processing interior layer structures of the component carriers, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

By providing separator bodies having a low roughness, a high temperature robustness (for instance up to 300° C.) and a non-adhesive property preventing contamination of component carriers with foreign materials, a highly appropriate structure is provided for separating adjacent arrays of component carriers in a stack during back-end processing. Highly advantageously, a material of such a separator body or sheet may be made of a sulfur-free material for providing compatibility with gold surface finish manufacturing processes. By separating arrays of component carriers by separator bodies during back-end processing, a high throughput and yield may be obtained also in case of critically small line/space values of the component carriers. Thus, a fully automated interleaf adopted system may be provided using such separator bodies for disabling a direct contact between adjacent arrays.

In component carrier manufacturing technology, unit sizes are getting smaller and as a matter of fact, by tightening the inspection requirements, a back-end defect rate may increase. This particularly holds for the defects of scratching and undesired transfer of process residues. In terms of embodiments of the present invention, it has been surprisingly found that a main cause for such and other defects is the fact that conventionally stacked arrays are in direct contact with each other so that the component carriers of the arrays are in direct face-to-face contact and are therefore prone to scratches and the transfer of undesired process residues. By interposing separator bodies between neighbored arrays of a stack, such a direct contact between arrays may be prevented and the arrays may be protected against failure. According to an exemplary embodiment of the invention, an automated interleaf system for back-end processes and in particular for a baking procedure during back-end processing component carriers on array level may thus be provided.

An interleaf loader and unloader function may automatically form the stack, when possible during back-end processing. However, when unstacking is desired for certain back-end procedures (such as carrying out an electric test, for which the stack should be unstacked into the individual arrays, or for proper optical inspection), the loader and unloader function may be of advantage. Advantageously, a baking process may be carried out with separator bodies between adjacent arrays, which is particularly efficient. Preferably, the separator bodies may be heat-resistant, for instance up to 300° C., to withstand a baking process without being damaged. By separating adjacent arrays by a respective separator body, the defect rate may be decreased, and the yield may be increased. This particularly applies to a significant reduction of failures and defects such as scratching and undesired carryover of process residues. Furthermore, such a separator body may prohibit foreign materials to stick on the array surface, in particular during high temperature treatment.

Conventionally, adjacent arrays remain in direct physical contact with each other in production processes and also for a nitrogen baking procedure. Face to face contact between arrays in back-end processing may however cause a high rate of process residue and scratches. As confirmed by tests, a higher rate of such and other defects comes from stacked arrays without any intermediate layer. As confirmed by tests as well, a higher rate of such defects also comes from relative sliding movements of arrays without any intermediate layer. If there is any foreign material or residual material from the manufacturing process, such materials may stick on an array surface of arrays in direct physical contact with each other, for instance in a baking process. Consequently, this kind of attached particles cannot be removed afterwards which may result in a dramatic yield loss in terms of component carrier manufacture.

In order to at least partially overcome the above-mentioned and/or other shortcomings, exemplary embodiments of the invention may implement a fully automated interleaf handling. In particular, baking may be utilized with interleaf or separator sheet, and thus it may be highly advantageous to provide a heat resistant interleaf or separator sheet.

In particular, a fully automated interleaf adopted system according to an exemplary embodiment of the invention may include at least one of the following:
1) A fully automated interleaf handling for the whole back-end process.
2) Baking utilized with interleaf (for instance a paper type separator sheet). Thus, an exemplary embodiment of the invention may use a paper type interleaf or separator sheet to reduce defect rates and the influence of foreign material.

Hence, an embodiment of the invention may add an interleaf (such as a separator paper) into back-end processes of component carrier manufacture. This may decrease a defect rate and may increase the yield especially what concerns process residue and scratches. An exemplary embodiment may therefore implement an automated interleaf handling to prevent additional defects caused by manual interleaf handling. More specifically, a baking process may be utilized with interleaf so as to prohibit foreign material particles to stick to an array surface, in particular during high temperature processing, to increase yield. Embodiments may be implemented with low effort and properly compatible with different technologies (such as high-density integration (HDI), modified semi-additive processing (mSAP) and semi-additive processing (SAP)). Thus, it may become possible to use automatically fed interleafs in a back-end process for protecting stacked arrays from defects.

Figures 1, 2:
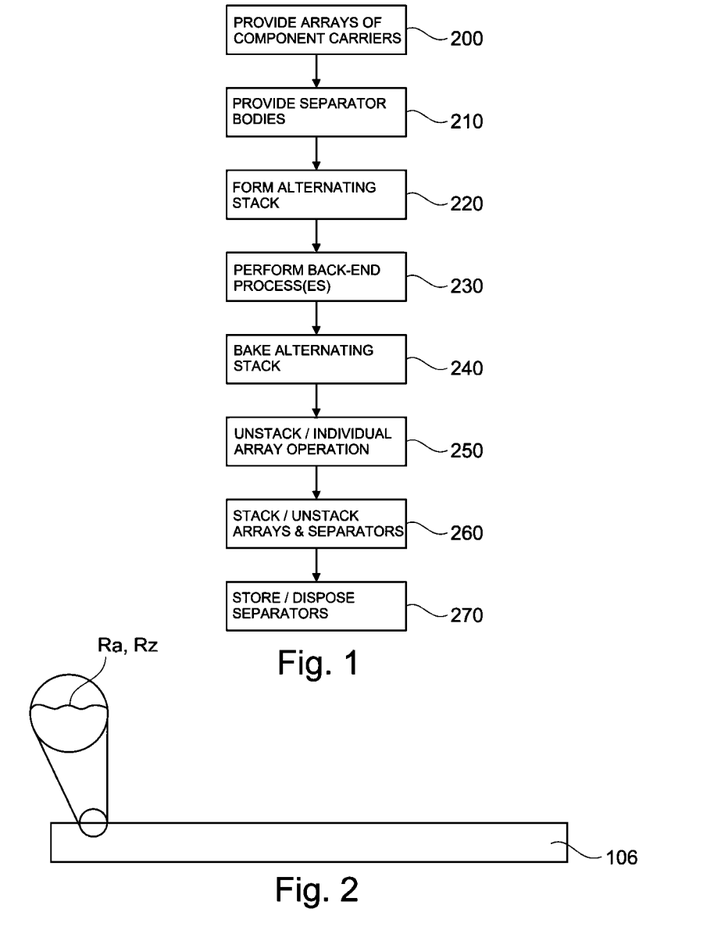
FIG. 1 illustrates a block diagram of a method of back-end processing component carriers according to an exemplary embodiment of the invention.
FIG. 2 illustrates a cross-sectional view of a separator sheet for separating arrays of component carriers during back-end processing of component carriers according to an exemplary embodiment of the invention.

FIG. 1 illustrates a block diagram of a method of back-end processing component carriers 100 according to an exemplary embodiment of the invention.

Firstly, an overview of the method is given. Thereafter, the individual procedures will be described in further detail based on the blocks shown in FIG. 1. The reference numerals used for the following description relate to FIG. 2 and FIG. 4.

In terms of such a method of processing component carriers 100, it may be possible to provide a plurality of arrays 104 each comprising a plurality of component carriers 100. Furthermore, a plurality of separator bodies 106 may be provided. It may furthermore be possible to form an alternating stack 108 of the arrays 104 and the separator bodies 106 so that each adjacent pair of stacked arrays 104 is spaced by a respective separator body 106. Moreover, it may be possible to carry out at least one back-end process using the stack 108.

More specifically, the method may comprise carrying out said at least one back-end process while the arrays 104 remain stacked with the separator bodies 106. For instance, said at least one back-end process comprises baking.

Advantageously, the method may also comprise maintaining the stack 108 between subsequent back-end processes, and individually picking each array 104 from the stack 108 for carrying out a respective one of said back-end processes with the respective picked array 104. For example, said at least one back-end process may comprises a functional electric test, an automatic optical inspection and/or laser marking a defective array 104 or a defective component carrier 100 of the array 104.

In an embodiment, the method may also comprise again forming an alternating stack 108 of the arrays 104 and the separator bodies 106 so that each adjacent pair of stacked arrays 104 is spaced by a respective separator body 106 after said back-end process carried out with the respective picked array 104.

It may be possible to provide the separator bodies 106 and the arrays 104 so that main surface areas 110 of each separator body 106 are equal to main surface areas 112 of each array 104. The described procedure may allow forming the line/space ratio of the component carriers 100 manufactured based on the arrays 104 smaller than 30 µm, in particular in a range between 1 µm and 30 µm. It may be possible to reuse or throw away the separator bodies 106 after the back-end processing. Advantageously, it may be possible to automatically handle separator sheets 106 for spacing arrays 104, preferably without touching by a human operator. Furthermore, the method may comprise unstacking and restacking the stack 108 of the arrays 104 and the separator bodies 106 between subsequent back-end processes.

Referring now to FIG. 1, block 200 illustrates the process of providing a plurality of arrays 104 each comprising a plurality of component carriers 100. For instance, the arrays 104 may be separated from a panel during processing component carriers 100 such as printed circuit boards or IC (integrated circuit) substrates.

As can be taken from a block 210, the method may further comprise providing a plurality of separator bodies 106, such as high temperature-stable paper sheets with a smooth surface being non-adhesive for foreign material.

As can be taken from block 220, an alternating stack 108 of the arrays 104 and the separator bodies 106 may be formed. Thus, each array 104 is spatially separated from other arrays 104 so as to render impossible a direct physical contact with other arrays 104. The spatial separation may be accomplished by sandwiching a respective separator body 106 between two arrays 104. Also, an exposed exterior surface of an array 104 may be covered with a respective separator body 106 to prevent contamination from the environment.

Thereafter, as shown in block 230 in FIG. 1, one or more back-end processes may be carried out using the stack 108, i.e., based on the stacked configuration of arrays 104 and separator bodies 106.

As indicated by a block 240, one or more of the back-end processes may be carried out while the stack of arrays 104 and separator bodies 106 remains connected. An example is a baking process for dewarping and deoxidizing the arrays 106 and their preforms of component carriers 100.

As indicated by block 250, one or more other back-end processes may be carried out with the arrays 104 individually, i.e., after unstacking the stack 108 for individual back-end treatment of each array 104. Corresponding procedures which can be carried out with the arrays 104 individually are an electric functional test, automatic optical inspection, laser marking, etc.

As indicated by block 260, the procedures according to block 240 and block 250 may be separated by a repeated stacking and unstacking of the individual arrays 104 and separator bodies 106.

Block 270 shows that, after having carried out the back-end processing, the separator bodies 106 may be reused or disposed.

FIG. 2 illustrates a cross-sectional view of a separator sheet 106 for separating arrays 104 of component carriers 100 during back-end processing of component carriers 100 according to an exemplary embodiment of the invention.

The separator sheet 106 illustrated in FIG. 2 is configured for spacing arrays 104 each comprising a plurality of component carriers 100. For this purpose, the separator sheet 106 is made of material which is temperature stable at least up to 300° C. (so as to be capable of withstanding thermal load during baking). Furthermore, the material of the separator sheet 106 may have a surface roughness Ra preferably below 2 µm and a surface roughness Rz preferably below 10 µm (so that no scratching of arrays 104 occurs). Moreover, the material of the separator sheet 106 may be non-adhesive with respect to foreign particles, so that no contamination of the arrays 104 with foreign particles such as dust may occur. Preferably, a material of the separator sheet 106 is paper so that it can be manufactured with low effort. It is furthermore advantageous that the separator sheet 106 is sulfur-free, to achieve compatibility with gold processes. For instance, the separator sheet 106 may be made of sulfur free paper. Just as an example, the separator sheet may have dimensions in length and width directions of 95 mm×240.5 mm, with a thickness of 65 µm. In an embodiment, each of the aforementioned dimensions may vary by ±50% around the mentioned values.

A separator sheet 106 according to FIG. 2 and having the described properties may thus be highly appropriate for spacing the arrays 104 of preforms of component carriers 100 during at least part of back-end processing the arrays 104, or even during the entire back-end process.

FIG. 2 shows that each of the separator bodies 106 may be embodied as a sheet of paper with the mentioned small roughness values Ra, Rz. The material of the paper should be selected so as to be heat-resistant up to 300° C. The surface of the paper should be smooth enough for preventing undesired adhesion of foreign particles to the surface of the separator sheet 106 for preventing undesired contamination of the component carriers 100 of the arrays 104. This is in particular important for critically small line/space ratios below 30 µm. At the same time, the smooth surface of the separator body 106 reduces the risk of scratching of the arrays 104. In FIG. 2, a single layer separator body 106 is shown which is particularly simple and cheap in manufacture. It is however also possible that the separator bodies 106 are multi-layer structures, such as a plastic core layer covered with a smooth non-adhesive surface layer, such as PTFE.

Figures 3, 4:
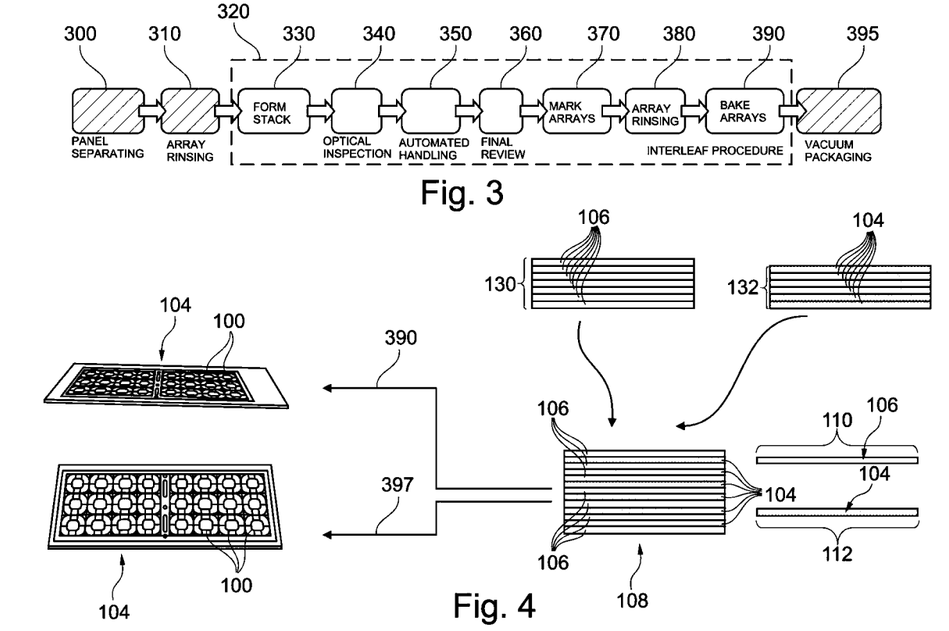
FIG. 3 illustrates a block diagram illustrating processing stages during back-end processing of arrays comprising preforms of component carriers according to an exemplary embodiment of the invention.
FIG. 4 illustrates a stack with an alternating sequence of arrays of component carriers and separator sheets during back-end processing according to another exemplary embodiment of the invention.

FIG. 3 illustrates a block diagram illustrating processing stages during back-end processing of arrays 104 comprising preforms of component carriers 100 according to an exemplary embodiment of the invention.

FIG. 3 shows an overview of a back-end process in which the concept of separator bodies 106 has been integrated.

In a routing procedure 300, a panel may be separated into multiple arrays 104. In a subsequent high-pressure rinse procedure 310, the arrays 104 may be cleaned and potential burrs may be removed.

As indicated by reference numeral 320, thereafter the concept of separator bodies 106 according to an exemplary embodiment of the invention is initiated. A stack 108 may be formed as an alternating sequence of an array 104, a separator body 106, an array 104, a separator body 106, and so on.

Procedure 330 denotes an electric test during which the stack 108 of arrays 104 and separator bodies 106 may be temporarily unstacked. During such an electric test it is tested whether a respective component carrier 100 of a respective array 106 works electrically properly or not.

In a subsequent automatic visual inspection procedure, see reference numeral 340, each array 104 is imaged, and the array image is compared with a reference image. During such an automatic optical inspection, it is possible to identify potential defects, such as erroneously connected traces or erroneously disconnected traces of a component carrier 100 of the array 104. Also, during automatic visual inspection in block 340, it is possible to temporarily unstack the stack 108 of separator bodies 106 and arrays 104.

Block 350 indicates an automated handling of the stack.

By final inspection, see block 360, the arrays 104 may be individually manually inspected by a human operator. Alternatively, this task may be accomplished by a machine. For this purpose, the stack 108 of separator bodies 106 and arrays 104 may be again unstacked so as to allow individual inspection of each array 104.

Laser marking, see block 370, can also be done individually, i.e., after unstacking the stack 108 to laser mark each array 104 or component carrier 100 thereof individually.

Thereafter, see reference numeral 380, a further high-pressure rinse procedure may be carried out for cleaning the individual arrays 104. This may be done in a stacked or preferably in an unstacked configuration of the arrays 104.

A baking procedure, see block 390, is carried out preferably in nitrogen atmosphere and is done for dewarping and deoxidizing the component carriers 100 of the array 104. For this purpose, the entire stack 108, as shown in FIG. 4, can be inserted as a whole in an oven so that the separator bodies 106 may also be placed in the oven during the baking process. It has turned out that the separator sheets 106 are capable of withstanding the high temperatures of typically up to 300° C. in such a baking oven.

Thereafter, the interleaf procedure 320 is completed. The commonly baked stack 108 is unstacked and the individual component carriers 100 or arrays 104 are made subject to vacuum packing, see reference numeral 395.

FIG. 4 illustrates a stack 108 with an alternating sequence of arrays 104 of component carriers 100 and separator sheets 106 during back-end processing according to another exemplary embodiment of the invention.

FIG. 4 shows a cross-sectional view of the stack 108 of separator bodies 106 and arrays 104. The stack 108 is configured so that none of the arrays 104 has an exposed main surface, since both opposing main surfaces of each array 104 are covered by a respective separator body 106. Therefore, two separator bodies 106 also form the upper and lower limits of the stack 108. As can be taken from FIG. 4 as well, the stack 108 may be formed based on individual stack 130 of separator bodies 106 only and individual stack 132 of arrays 104 only. As also indicated schematically, the stack 108 may be subject to a common nitrogen baking process, see reference numeral 390, or to any other appropriate back-end process, see reference numeral 397.

Figure 5:
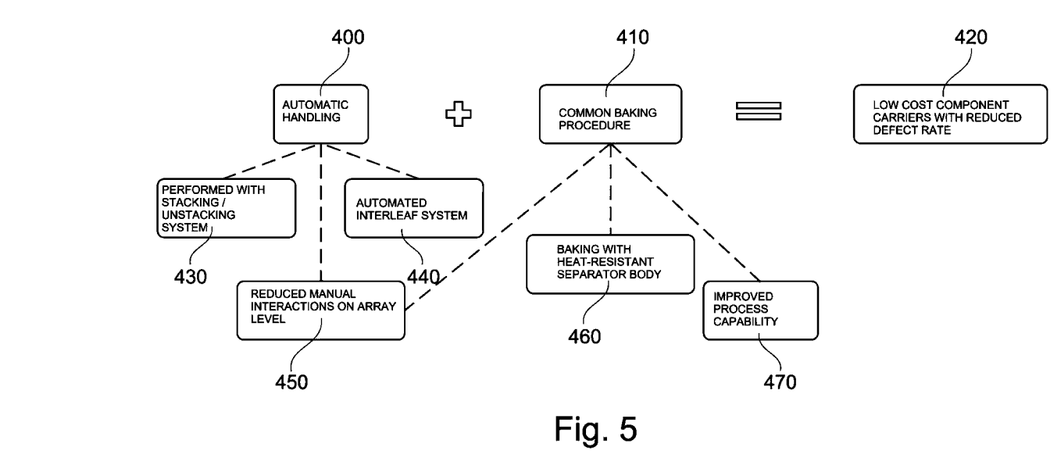
FIG. 5 illustrates a flowchart of a method of processing component carriers according to another exemplary embodiment of the invention.

FIG. 5 illustrates a flowchart of a method of processing component carriers 100 according to another exemplary embodiment of the invention.

FIG. 5 descriptively summarizes certain aspects of embodiments of the invention. A highly advantageous aspect is the combination of an automated handling of arrays 104 and separator bodies 106, as indicated by a block 400. This may be advantageously combined with a configuration of each separator body 106 with a high heat resistance and using the same for a common baking procedure (see block 410). As a result, as indicated schematically in a block 420, manufacture of component carriers 100 can be carried out with low cost and a reduced defect rate, which is also applicable to very different types of manufacturing plants.

Again, referring to block 400, automated handling may be accomplished with tools being equipped with a built-in stacking/unstacking system, see reference numeral 430. Furthermore, it may be advantageous to provide a fully automated interleaf system, see block 440. Manual interactions on array level after a routing process (during which a panel may be separated into the arrays) may thus be reduced, as indicated in a block 450. Advantageously, a baking process may be carried out with a heat-resistant separator body, see block 460. As indicated by a block 470, the process capability may thereby be improved.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of processing component carriers, comprising:
providing a plurality of arrays each comprising a plurality of component carriers;
providing a plurality of separator bodies;
forming an alternating stack of the arrays and the separator bodies so that each adjacent pair of stacked arrays is spaced by a respective separator body; and
carrying out at least one process using the stack,
wherein the separator bodies are separator sheets and the separator sheets have a thickness in a range between 30 μm and 100 μm.

2. The method according to claim 1, wherein the method comprises performing the at least one process while the arrays remain stacked with the separator bodies in between.

3. The method according to claim 2, further comprising: baking the stack.

4. The method according to claim 3, wherein the method comprises baking the stack in an oven at a temperature of at least 200° C.

5. The method according to claim 1, wherein the method comprises handling the stack for transferring the stack between subsequent processes.

6. The method according to claim 1, wherein the method comprises maintaining the stack between subsequent processes and individually picking each array from the stack for carrying out at least one of said subsequent processes with the respective picked array.

7. The method according to claim 6, wherein said at least one subsequent process carried out with an individually picked array comprises carrying out a functional test.

8. The method according to claim 6, wherein said at least one subsequent process carried out with an individually picked array comprises carrying out an inspection.

9. The method according to claim 6, wherein said at least one subsequent process carried out with an individually picked array comprises marking a defective array or a defective component carrier of the array.

10. The method according to claim 6, wherein said at least one subsequent process carried out with an individually picked array comprises cleaning the stack.

11. The method according to claim 6, wherein the method comprises forming again an alternating stack of the arrays and the separator bodies after said at least one subsequent process carried out with individually picked arrays, so that each adjacent pair of stacked arrays is again spaced by a respective separator body.

12. The method according to claim 1, wherein the method comprises providing the separator bodies and the arrays so that a main surface area of each separator body is equal to a main surface area of each array.

13. The method according to claim 1 wherein the method comprises forming a line/space ratio of the component carriers manufactured based on the arrays smaller than 30 µm.

14. The method according to claim 1, comprising at least one of the following features:
wherein the method comprises reusing or disposing the separator bodies;
wherein the method comprises carrying out unstacking and re-stacking the stack of the arrays and the separator bodies between subsequent processes.

15. The method according to claim 1, comprising at least one of the following features:
wherein the component carriers comprise at least one electrically conductive layer structure which comprises at least one of the group consisting of copper, aluminum, nickel, silver, gold, titanium, palladium, and tungsten;
wherein the component carriers comprise at least one electrically insulating layer structure which comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carriers are shaped as a plate;
wherein the component carriers are configured as one of the group consisting of a printed circuit board, and a substrate, or a preform thereof;
wherein the component carrier is configured as a laminate-type component carrier.

16. The method according to claim 1, wherein the separator sheets:
are temperature stable at least up to 300° C.;
have a surface roughness Ra below 3 µm; and
are non-adhesive with respect to foreign particles.

17. The method according to claim 16, comprising at least one of the following features:
wherein the separator sheets comprise paper;
wherein the separator sheets are sulphur-free;
wherein the separator sheets have a surface roughness Ra below 2 µm;
wherein the separator sheets have a surface roughness Rz below 20 µm;
wherein the separator sheets have a thickness in a range between 50 µm and 80 µm;
wherein the separator sheets comprise at least one material of the group consisting of an electrostatic discharge control material, ultra-high molecular weight polyethylene, polyoxymethylene, silicon, polyethylene terephthalate, and polyetheretherketone;
wherein the separator sheets are configured to protect the arrays against at least one of the group consisting of vibration, mechanical shock, and humidity;
wherein the separator sheets comprise at least one hole for supporting vacuum suction of an adjacent array.

18. The method according to claim 16, wherein the method comprises automatically handling an alternating stack of said separator sheets and said arrays without touching by a human operator.

* * * * *

UNITED STATES PATENT AND TRADEMARK OFFICE
CERTIFICATE OF CORRECTION

| | | |
|---|---|---|
| PATENT NO. | : 11,943,874 B2 | Page 1 of 1 |
| APPLICATION NO. | : 17/247456 | |
| DATED | : March 26, 2024 | |
| INVENTOR(S) | : Amin Nickkholgh, Yu-Hui Wu and Ismadi Bin Ismail | |

It is certified that error appears in the above-identified patent and that said Letters Patent is hereby corrected as shown below:

On the Title Page

In item (12) United States Patent, before "et al." replace -- Nickkolgh -- with -- Nickkholgh --

In item (72) Inventors, after "Amin" replace -- Nickkolgh -- with -- Nickkholgh --

Signed and Sealed this
Ninth Day of September, 2025

Coke Morgan Stewart
*Acting Director of the United States Patent and Trademark Office*